United States Patent
Solt et al.

(10) Patent No.: US 8,208,326 B1
(45) Date of Patent: Jun. 26, 2012

(54) METHOD AND APPARATUS FOR MEMORY TEST

(75) Inventors: Yosef Solt, Atzmon-Segev (IL); Ofir Keren, Moshav Amirim (IL)

(73) Assignee: Marvell Israel (M.I.S.L) Ltd., Yokneam (IL)

( * ) Notice: Subject to any disclaimer, the term of this patent is extended or adjusted under 35 U.S.C. 154(b) by 171 days.

(21) Appl. No.: 12/797,075

(22) Filed: Jun. 9, 2010

Related U.S. Application Data

(60) Provisional application No. 61/185,323, filed on Jun. 9, 2009, provisional application No. 61/228,477, filed on Jul. 24, 2009.

(51) Int. Cl.
*G11C 7/00* (2006.01)
(52) U.S. Cl. .......................... 365/201; 714/738
(58) Field of Classification Search .................. 365/201, 365/230.02; 714/738, 742
See application file for complete search history.

(56) References Cited

U.S. PATENT DOCUMENTS

| | | | | |
|---|---|---|---|---|
| 6,073,263 | A * | 6/2000 | Arkin et al. ................... | 714/738 |
| 6,094,738 | A * | 7/2000 | Yamada et al. ................ | 714/738 |
| 6,718,487 | B1 * | 4/2004 | Sommer ......................... | 714/42 |
| 7,058,865 | B2 * | 6/2006 | Mori et al. ..................... | 714/724 |

\* cited by examiner

*Primary Examiner* — Son Dinh

(57) ABSTRACT

Aspects of the disclosure provide an integrated circuit that is configured for parallel memory testing. The integrated circuit includes a first memory block and a first scrambler coupled to the first memory block during a memory testing. The first memory block includes a first memory array, and a first envelope configured to translate a driving address of the first memory block into a corresponding physical address of the first memory array based on a first memory configuration for using the first memory array. The first scrambler is configured to provide a first plurality of driving addresses and associated first data to the first envelope based on the first memory configuration. The first plurality of driving addresses and the first data are used to test the first memory array according to a first test pattern. Further, the integrated circuit includes a second memory block and a second scrambler coupled to the second memory block during the memory testing. The second memory block includes a second memory array, and a second envelope configured to translate a driving address into a physical address of the second memory array based on a second memory configuration for using the second memory array. The second scrambler is configured to provide a second plurality of driving addresses and associated second data to the second envelope based on the second memory configuration. The second plurality of driving addresses and the second data are used to test the second memory array according to a second test pattern.

20 Claims, 7 Drawing Sheets

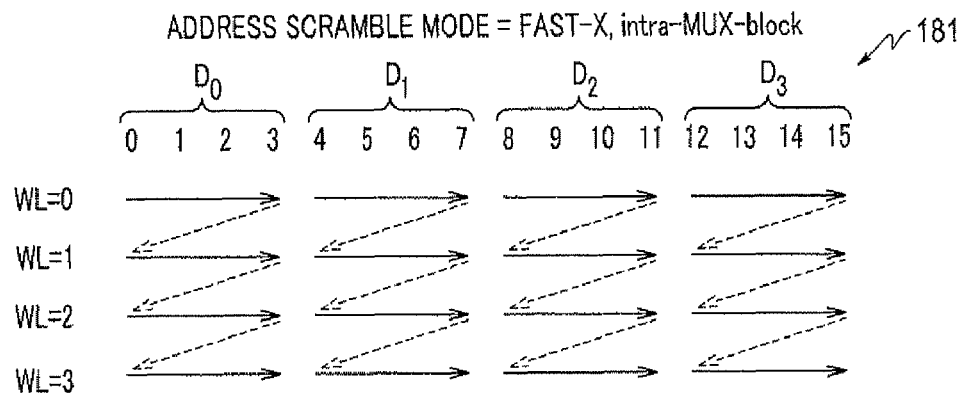
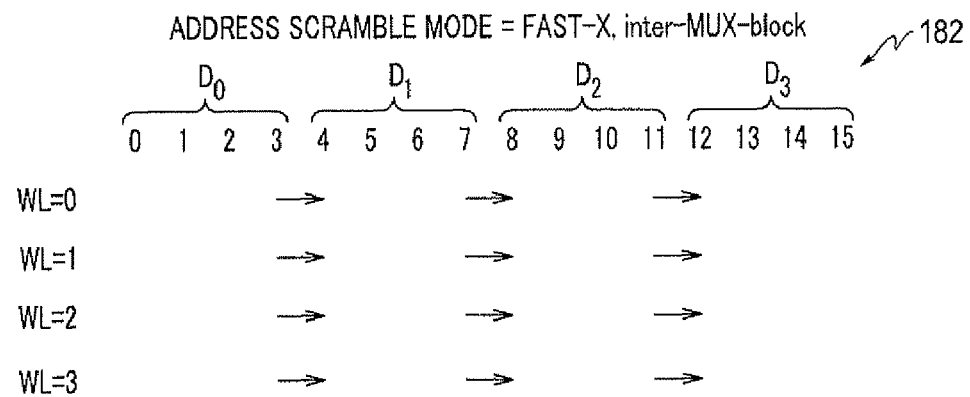
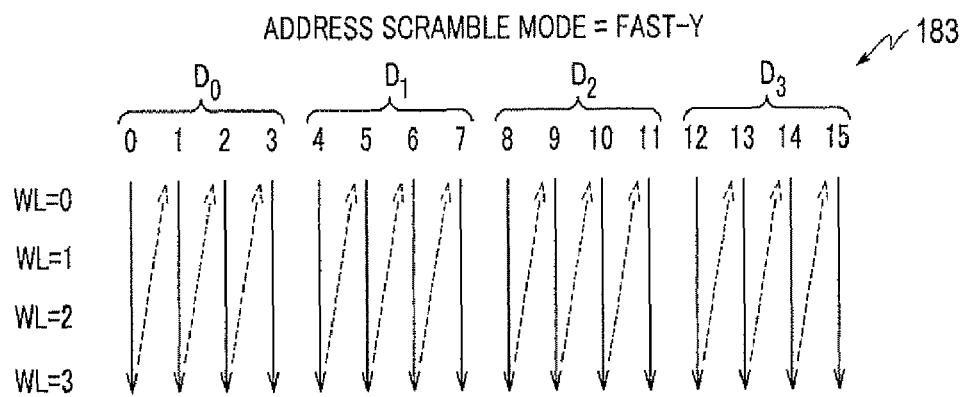
FIG. 1B

DATA SCRAMBLE MODE = SOLID  　　　　　　　　　　　　　　　～184

|      | 0 | 1 | 2 | 3 | 4 | 5 | 6 | 7 | 8 | 9 | 10 | 11 | 12 | 13 | 14 | 15 |
|------|---|---|---|---|---|---|---|---|---|---|----|----|----|----|----|----|
| WL=0 | 0/1 | 0/1 | 0/1 | 0/1 | 0/1 | 0/1 | 0/1 | 0/1 | 0/1 | 0/1 | 0/1 | 0/1 | 0/1 | 0/1 | 0/1 | 0/1 |
| WL=1 | 0/1 | 0/1 | 0/1 | 0/1 | 0/1 | 0/1 | 0/1 | 0/1 | 0/1 | 0/1 | 0/1 | 0/1 | 0/1 | 0/1 | 0/1 | 0/1 |
| WL=2 | 0/1 | 0/1 | 0/1 | 0/1 | 0/1 | 0/1 | 0/1 | 0/1 | 0/1 | 0/1 | 0/1 | 0/1 | 0/1 | 0/1 | 0/1 | 0/1 |
| WL=3 | 0/1 | 0/1 | 0/1 | 0/1 | 0/1 | 0/1 | 0/1 | 0/1 | 0/1 | 0/1 | 0/1 | 0/1 | 0/1 | 0/1 | 0/1 | 0/1 |

DATA SCRAMBLE MODE = CHECKER BOARD 　　　　　　　　～185

|      | 0 | 1 | 2 | 3 | 4 | 5 | 6 | 7 | 8 | 9 | 10 | 11 | 12 | 13 | 14 | 15 |
|------|---|---|---|---|---|---|---|---|---|---|----|----|----|----|----|----|
| WL=0 | 0 | 1 | 0 | 1 | 0 | 1 | 0 | 1 | 0 | 1 | 0 | 1 | 0 | 1 | 0 | 1 |
| WL=1 | 1 | 0 | 1 | 0 | 1 | 0 | 1 | 0 | 1 | 0 | 1 | 0 | 1 | 0 | 1 | 0 |
| WL=2 | 0 | 1 | 0 | 1 | 0 | 1 | 0 | 1 | 0 | 1 | 0 | 1 | 0 | 1 | 0 | 1 |
| WL=3 | 1 | 0 | 1 | 0 | 1 | 0 | 1 | 0 | 1 | 0 | 1 | 0 | 1 | 0 | 1 | 0 |

DATA SCRAMBLE MODE = STRIPE

～186　　　　　　　　　　　　　　～187
　　　　　FAST-Y　　　　　　　　　　　　　FAST-X
WL=0 1 1 1 1 1 1 1 1 1 1 1 1 1 1 1 1　　WL=0 0 1 0 1 0 1 0 1 0 1 0 1 0 1 0 1
WL=1 0 0 0 0 0 0 0 0 0 0 0 0 0 0 0 0　　WL=1 0 1 0 1 0 1 0 1 0 1 0 1 0 1 0 1
WL=2 1 1 1 1 1 1 1 1 1 1 1 1 1 1 1 1　　WL=2 0 1 0 1 0 1 0 1 0 1 0 1 0 1 0 1
WL=3 0 0 0 0 0 0 0 0 0 0 0 0 0 0 0 0　　WL=3 0 1 0 1 0 1 0 1 0 1 0 1 0 1 0 1

LA => Test Address in Logical Address (Signal that comes from the BIST controller).  
I_DT => Test Data in Data Type (Signal that comes from the BIST controller).  ⎬ 410

ADD => Driving Address (Signal that goes to the memory block)  
DT => Driving Data in Data Type (Signal that goes to the memory block)  ⎬ 420

Data Type [1:0] = 00 => Data = 0000...00  
Data Type [1:0] = 01 => Data = 0101...01  
Data Type [1:0] = 10 => Data = 1010...10  ⎬ 425
Data Type [1:0] = 11 => Data = 1111...11

Address Scrambling:

Fast-X, Intra-MUX-block:
- No address changes (Logical Address).  ⎬ 430

Fast-X, Inter-MUX-block:
- MUX - 1: ADD[9:0] ={ LA[9:0]                    }
- MUX - 2: ADD[9:0] ={ LA[9:1], ~LA [0]           }
- MUX - 4: ADD[9:0] ={ LA[9:2], ~LA [1],LA[ 0]}  ⎬ 440
- MUX - 8: ADD[9:0] ={ LA[9:3], ~LA [2],LA[1:0]}
- MUX - 16: ADD[9:0] ={ LA[9:4], ~LA [3],LA[2:0]}
- MUX - 32: ADD[9:0] ={ LA[9:5], ~LA [4],LA[3:0]}

Fast-Y:
- MUX - 1: ADD[9:0] ={ LA[9:0]              }
- MUX - 2: ADD[9:0] ={ LA[8:0], LA [ 9]}
- MUX - 4: ADD[9:0] ={ LA[7:0], LA [9:8]}  ⎬ 450
- MUX - 8: ADD[9:0] ={ LA[6:0], LA [9:7]}
- MUX - 16: ADD[9:0] ={ LA[5:0], LA [9:6]}
- MUX - 32: ADD[9:0] ={ LA[4:0], LA [9:5]}

Data Scrambling:

Stripes (Horizontal for Fast-Y and Vertical for Fast-X):
- DT = I_DT ^ LA[0]  ⎬ 460

Checker Board:
- MUX - 1: DT[0] = I_DT[0] ^ ADD[0]
  DT[1] = I_DT[1] ^ ~ADD[0]
- MUX - 2: DT[0/1] = I_DT[0/1] ^ ADD[0] ^ ADD[1]
- MUX - 4: DT[0/1] = I_DT[0/1] ^ ADD[0] ^ ADD[2]  ⎬ 470
- MUX - 8: DT[0/1] = I_DT[0/1] ^ ADD[0] ^ ADD[3]
- MUX - 16: DT[0/1] = I_DT[0/1] ^ ADD[0] ^ ADD[4]
- MUX - 32: DT[0/1] = I_DT[0/1] ^ ADD[0] ^ ADD[5]

FIG. 4

METHOD AND APPARATUS FOR MEMORY TEST

INCORPORATION BY REFERENCE

This application claims the benefit of U.S. Provisional Application No. 61/185,323, "SRAM-Test Address Scrambler" filed on Jun. 9, 2009, and No. 61/228,477, "SRAM-Test Address Scrambler" filed on Jul. 24, 2009, which are incorporated herein by reference in their entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Generally, test patterns are generated in a logical address space. Due to differences in the physical structures of memories, the test patterns may appear differently on different memories.

SUMMARY

Aspects of the disclosure provide an integrated circuit that is configured for parallel memory testing. In accordance with an embodiment, the integrated circuit includes a first memory block and a first scrambler coupled to the first memory block during a memory testing. The first memory block includes a first memory array, and a first envelope configured to translate a driving address of the first memory block into a corresponding physical address of the first memory array based on a first memory configuration for using the first memory array. The first scrambler is configured to provide a first plurality of driving addresses and associated first data to the first envelope based on the first memory configuration. The first plurality of driving addresses and the first data are used to test the first memory array according to a first test pattern.

Further, the integrated circuit includes a second memory block and a second scrambler coupled to the second memory block during the memory testing. The second memory block includes a second memory array, and a second envelope configured to translate a driving address into a physical address of the second memory array based on a second memory configuration for using the second memory array. The second scrambler is configured to provide a second plurality of driving addresses and associated second data to the second envelope based on the second memory configuration. The second plurality of driving addresses and the second data are used to test the second memory array according to a second test pattern. In an embodiment, the first test pattern and the second test pattern are the same.

According to an aspect of the disclosure, the integrated circuit is configured for built-in self-test. In an embodiment, the integrated circuit includes a built-in self-test (GIST) controller that is configured to provide a plurality of test addresses and associated test data for testing the first memory array and the second memory array in parallel. Then, the first scrambler is configured to translate the plurality of test addresses into the first plurality of driving addresses and translate the test data into the first data for testing the first memory array according to the first test pattern. The second scrambler is configured to translate the plurality of test addresses into the second plurality of driving addresses and translate the test data into the second data for testing the second memory array according to the second test pattern. In an example, the plurality of test addresses is logical addresses, and does not depend on memory configurations.

In another embodiment, the built-in self-test controller is configured to provide an address scramble mode, and a data scramble mode to the first scrambler and the second scrambler. Then, the first scrambler is configured to provide the first plurality of driving addresses based on the first memory configuration and the address scramble mode, and to provide the first data based on the first memory configuration and the data scramble mode. The second scrambler is configured to provide the second plurality of driving addresses based on the second memory configuration and the address scramble mode, and to provide the second data based on the second memory configuration and the data scramble mode.

According to another aspect of the disclosure, the integrated circuit is tested from an external tester. The integrated circuit includes an I/O interface configured to receive a plurality of test addresses and associated test data from the external tester, and provide the plurality of test addresses and the associated test data to the first scrambler and the second scrambler to test the first memory array and the second memory array in parallel.

According to an embodiment of the disclosure, the memory configuration includes a multiplex configuration. The first memory block and the second memory block are configured to have a same multiplex (MUX) level or different MUX levels respectively.

Aspects of the disclosure can provide a method for memory testing. The method includes receiving by a first scrambler a plurality of test addresses and associated test data for testing a first memory array, translating the plurality of test addresses and associated test data into a first plurality of driving addresses and first data based on a first memory configuration for using the first memory array, and providing the first plurality of driving addresses and the first data to a first envelope that envelopes the first memory array. The first envelope translates the first plurality of driving addresses into a first plurality of physical addresses based on the first memory configuration, and then the first data is written to the first plurality of physical addresses of the first memory array.

Further, the method includes receiving by a second scrambler the plurality of test addresses and the test data for testing a second memory array, translating the plurality of test addresses and associated test data into a second plurality of driving addresses and second data based on a second memory configuration for using the second memory array, and providing the second plurality of driving addresses and the second data to a second envelope that envelopes the second memory array. The second envelope translates the second plurality of driving addresses into a second plurality of physical addresses based on the second memory configuration, and then the second data is written to the second plurality of physical addresses of the second memory array.

In an embodiment, the method includes receiving the plurality of test addresses and the test data generated by a built-in self-test (BIST) controller, and using the plurality of test addresses and the test data for testing the first memory array and the second memory array in parallel.

In another embodiment, the method includes receiving the plurality of test addresses and the test data from an external source, and using the plurality of test addresses and the test data for testing the first memory array and the second memory array in parallel.

According to another aspect of the disclosure, a method for memory testing includes receiving by a first scrambler an address scramble mode and a data scramble mode for testing a first memory array, generating a first plurality of driving addresses based on the addresses scramble mode and a first memory configuration for using the first memory array, generating first data based on the data scramble mode and the first memory configuration, and providing the first plurality of driving addresses and the first data to a first envelope that envelopes the first memory array. The first envelope translates the first plurality of driving addresses into a first plurality of physical addresses based on the first memory configuration, and the first data is written to the first plurality of physical addresses of the first memory array.

The method further includes receiving by a second scrambler the address scramble mode and the data scramble mode for testing a second memory array, generating a second plurality of driving addresses based on the addresses scramble mode and a second memory configuration for using the second memory array, generating second data based on the data scramble mode and the second memory configuration, and providing the second plurality of driving addresses and the second data to a second envelope that envelopes the second memory array. The second envelope translates the second plurality of driving addresses into a second plurality of physical addresses based on the second memory configuration, and the second data is written to the second plurality of physical addresses of the second memory array.

In an embodiment, the address scramble mode and the data scramble mode are determined and provided by a built-in self-test (BIST) controller to test the first memory array and the second memory array in parallel. Alternatively, the address scramble mode and the data scramble mode are provided from an external source.

BRIEF DESCRIPTION OF THE DRAWINGS

Various embodiments of this disclosure that are proposed as examples will be described in detail with reference to the following figures, wherein like numerals reference like elements, and wherein:

FIG. 1B shows address scramble mode examples 181-183 according to an embodiment of the disclosure;

FIG. 1C shows data scramble mode examples 184-187 according to an embodiment of the disclosure;

FIG. 4 shows a scrambler algorithm example 400 according to an embodiment of the disclosure.

DETAILED DESCRIPTION OF EMBODIMENTS

Figure 1A:
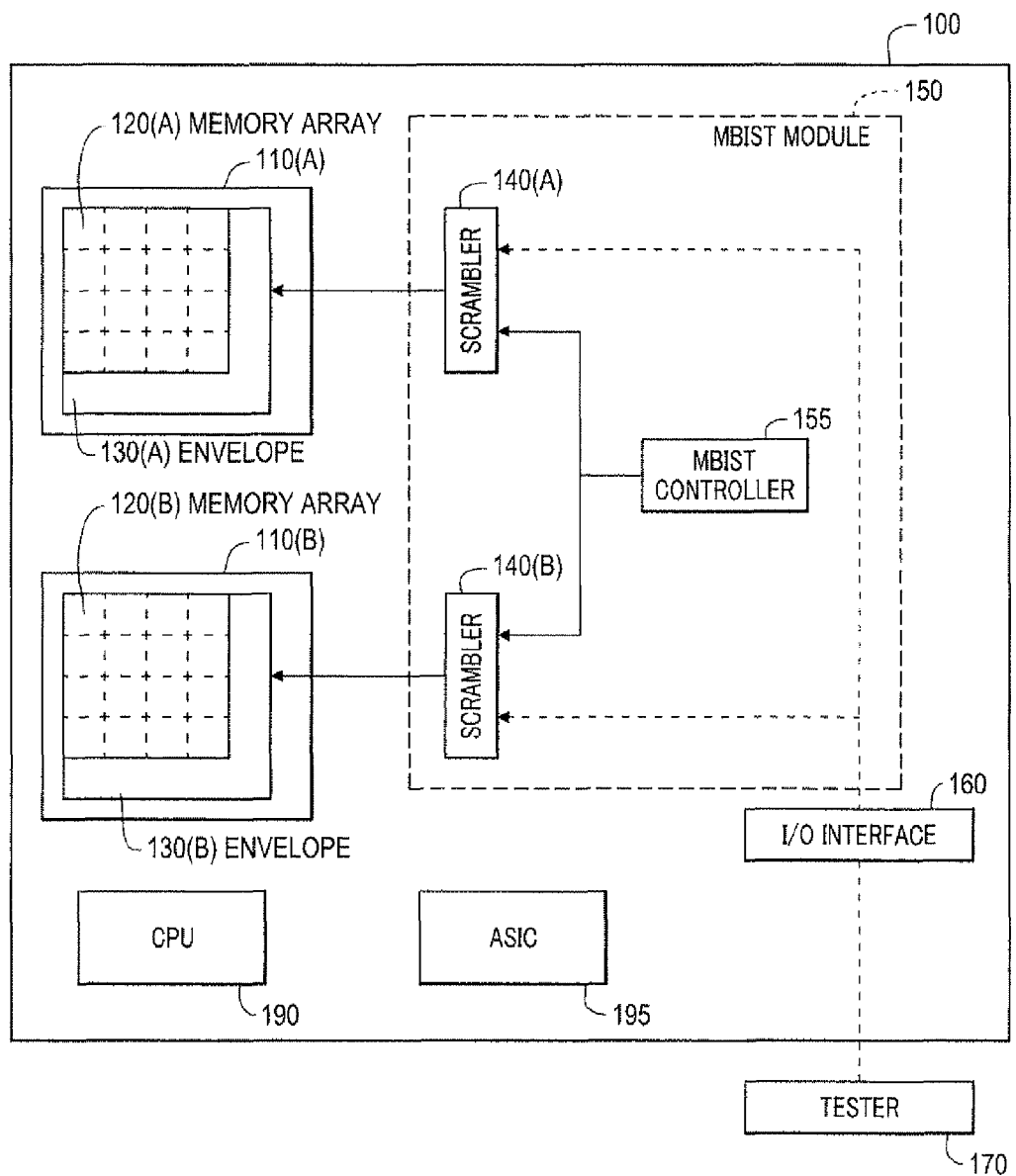
FIG. 1A shows a block diagram of an integrated circuit chip example 100 according to an embodiment of the disclosure.

FIG. 1A shows a block diagram of an integrated circuit (IC) chip example 100 according to an embodiment of the disclosure. The IC chip 100 is configured to assist memory testing. The IC chip 100 includes a plurality of memory blocks 110 (A-B), and a memory built-in self-test (MBIST) module 150. The MBIST module 150 is coupled to the plurality of memory blocks 110(A-B) during a memory test to perform, in parallel, built-in self-test of the plurality of memory blocks 110(A-B). The IC chip 100 can include any other suitable circuit module, such as a central processing unit (CPU) 190, an application specific integrated circuit (ASIC) module 195, and the like.

In an embodiment, the memory blocks 110(A-B) are static random access memory (SRAM) blocks. It is noted that, in an embodiment, the memory blocks 110(A-B) are other suitable memory structure, such as dynamic random access memory (DRAM), electrically erasable and programmable read-only memory (EEPROM), and the like.

The plurality of memory blocks 110(A-B) is individually configured according to various aspects, such as functional requirements, design considerations, resource limitations, performance optimization, and the like, during design of the IC chip 100. Thus, the plurality of memory blocks 110(A-B) may have same or different memory configurations. In an example, the memory block 110(A) includes a memory array 120(A), and an envelope 130(A) that encloses the memory array 120(A). The envelope 130(A) includes any suitable circuit to map a driving address space of the memory block 110(A) to a physical address space of the memory array 120(A). The driving address space and the physical address space can be different. In an example, the physical address space is 64 by 64 bits, and the driving address space is 128 by 32 bits. When a driving address in the driving address space is received, the envelope 130(A) translates the driving address to a corresponding physical address in the physical address space.

In an embodiment, the envelope 130(A) includes suitable circuit to configure the memory array 120(A) according to a multiplexed architecture. For example, when each memory line in the memory array 120(A) includes 32 cells, the 32 cells are grouped into 8 MUX blocks that each MUX block includes four neighbor cells, and the four neighbor cells are multiplexed. Thus, for an 8-bit data, each bit is stored in a different MUX block. Such configuration has a MUX level of four (MUX-4). It is noted that the envelope 130(A) can be suitably configured according to various MUX levels, such as MUX-1, MUX-2, MUX-4, MUX-8, MUX-16, and MUX-32.

Similarly, the memory block 110(B) also includes a memory array 120(B), and an envelope 130(B) that encloses the memory array 120(B). The envelope 130(B) includes any suitable circuit to map a driving address space of the memory block 110(B) to a physical address space of the memory array 120(B).

The plurality of memory blocks 110(A-B) can have same or different driving spaces. In an example, the memory array 120(A) and the memory array 120(B) have different dimensions. In an example, the memory array 120(A) and the memory array 120(B) have same dimensions, such as 64 by 64 bits. However, the envelope 130(A) is suitably configured that the memory block 110(A) has a driving address space of 128 by 32, and the envelope 130(B) is suitably configured that the memory block 110(B) has a driving address space of 64 by 64. In another example, the memory array 120(A) is 128 by 32 bits, and the memory array 120(B) is 64 by 64 bits. The envelope 130(A) and the envelope 130(B) are suitably configured, such that the driving address spaces for the memory blocks 110(A) and 110(B) are the same, such as 128 by 32.

The MBIST module 150 is coupled to the plurality of memory blocks 110(A-B) during a BIST process to test the memory blocks 110(A-B) in parallel. Generally, the MBIST module 150 performs two types of operations for testing memory. The two types of operations are writing operations and reading operations. For a writing operation, the MBIST module 150 provides a test address, and test data for writing to the test address. For a reading operation, the MBIST module 150 provides a test address for reading.

The MBIST module 150 includes a MBIST controller 155 and a plurality of scramblers 140(A-B). In an example, the MBIST controller 155 generates test patterns during a BIST process for testing the plurality of memory blocks 110(A-B), applies the generated test patterns to the plurality of memory blocks 110(A-B) via the plurality of scramblers 140(A-B), obtains test results, and processes the test results.

The plurality of scramblers 140(A-B) is respectively coupled to the plurality of memory blocks 110(A-B) during the BIST process. In an example, for a writing operation, each scrambler 140 receives the test address and test data from the MBIST controller 155, suitably scrambles the test address and the test data based on the memory configuration of the coupled memory block 110, and thus translates the test address into a driving address and translates the test data into driving data. Then, the driving address and driving data are provided to the coupled memory block 110 for the writing operation. In an example, for a reading operation, each scrambler 140 receives the test address from the MBIST controller 155, suitably scrambles the reading address based on the memory configuration of the coupled memory block 110, and thus translates the test address into a driving address for reading. The driving address is provided to the coupled memory block 110 for the reading operation.

In an embodiment, the MBIST controller 155 provides the test addresses, test data corresponding to a test pattern in a logical address space that does not take consideration of the memory configuration. The plurality of scramblers 140(A-B) maps the logic address space to respective driving address space of the plurality of memory blocks 110(A-B). Specifically, the plurality of scramblers 140(A-B) operates in parallel to respectively translate the test addresses and the test data according to the memory configuration of the respectively coupled memory blocks 110(A-B). Then, the envelopes 130 (A-B) respectively map the driving address space to the physical address space, and translate the driving addresses to the physical addresses. Thus, the same test pattern is applied to the plurality of memory arrays 120(A-B) and the plurality of memory blocks 110(A-B) is tested in parallel to save test time.

For example, the scrambler 140(A) is coupled to the memory block 110(A) during a BIST process, and the scrambler 140(B) is coupled to the memory block 110(B) during the BIST process. During the BIST process, the MBIST controller 155 determines a test pattern for testing, and provides test addresses and corresponding test data in the logical address space for creating the test pattern in the plurality of memory blocks 110(A-B).

The scrambler 140(A) translates the test addresses and the corresponding test data into first driving addresses and first driving data based on the memory configuration of the memory block 110(A), and provides the first driving addresses and the first driving data to the memory block 110(A). Then, the envelope 130(A) of the memory block 110(A) translates the first driving addresses into first physical addresses of the memory array 120(A) based on the memory configuration, and writes the first data into the first physical addresses of the memory array 120(A).

In parallel, the scrambler 140(B) translates the writing addresses and corresponding data into second driving addresses and second driving data based on the memory configuration of the memory block 110(B) and provides the second driving addresses and the second driving data to the memory block 110(B). Then, the envelope 130(B) of the memory block 110(B) translates the second driving addresses into second physical addresses of the memory array 120(B), and writes the second data into the second physical addresses of the memory array 120(B). Thus, the test pattern is applied to the memory arrays 120(A) and the 120(B) in parallel.

In an embodiment, the memory blocks 110(A) and 110(B) are of different MUX levels. To apply a test pattern, the MBIST controller 155 provides incremented logical addresses, such as from 0000 to FFFF, and the like, and solid data, such as 0, F, and the like. In addition, the MBIST controller 155 provides parameters to define an address scramble mode, and a data scramble mode. The scrambler 140(A) translates the provided logical addresses into the first driving addresses based on the address scramble mode and the MUX level of the memory block 110(A), and translates the provided solid data into the first driving data based on the data scramble mode and the MUX level of the memory block 110(A).

In parallel, the scrambler 140(B) translates the provided logical addresses into the second driving addresses based on the address scramble mode and the MUX level of the memory block 110(B), and translates the provided solid data into the second driving data based on the data scramble mode and the MUX level of the memory block 110(B).

In another embodiment, the MBIST controller 155 provides address scramble mode and data scramble mode to the scramblers 140(A-B). The scrambler 140(A) generates the first driving addresses based on the address scramble mode and the MUX level of the memory block 110(A), and generates the first driving data based on the data scramble mode and the MUX level of the memory block 110(A). In parallel, the scrambler 140(B) generates the second driving addresses based on the address scramble mode and the MUX level of the memory block 110(B), and generates the second driving data based on the data scramble mode and the MUX level of the memory block 110(B).

FIG. 1B shows address scramble mode examples 181-183 according to an embodiment of the disclosure. In FIG. 1B, a memory array is arranged into 4 word lines (WL from 0-3), and 16 columns. The 16 columns are grouped into 4 MUX blocks D0-D3. Each MUX block includes 4 columns, and the memory array has a MUX level of four. In an example, for each 4-bit binary data $b_3b_2b_1b_0$, $b_3$ is in one of the four columns of the D3 MUX block, $b_2$ is in one of the four columns of the D2 MUX block, $b_1$ is in one of the four columns of the D2 MUX block, and $b_0$ is in one of the four columns of the D0 MUX block.

Address scramble mode example 181 corresponds to fast-X, intra-MUX-block. The fast-X, intra-MUX-block refers to a physical stress test that stresses cells within a MUX block in X-axis direction. Address scramble mode example 182 corresponds to fast-X, inter-MUX-block. The fast-X, inter-MUX-block refers to a physical stress test that stresses neighbor cells that cross MUX blocks in X-axis direction. Address scramble mode example 183 corresponds to fast-Y. The fast-Y refers to a physical stress test that stresses cells in Y-axis direction.

FIG. 1C shows data scramble mode examples 184-187 according to an embodiment of the disclosure. Data scramble mode example 184 corresponds to a solid pattern. For the solid pattern, all the cells store 1 or 0. Data scramble mode example 185 corresponds to a checker board pattern. For the checker board pattern, cells store 1 or 0 alternatively in both X-axis direction and Y-axis direction, so that any two neighboring cells in X-axis direction and Y-axis direction store different binary values. It is noted that the data scramble mode example 185 can be suitably modified to correspond to a NOT-checker-board pattern that is a bit-inversion of the checker board pattern. Data scramble mode 186 corresponds to fast-Y stripe. The fast-Y stripe applies a physical stress test that stresses cells in Y-axis direction according to a horizontal stripe pattern. Data scramble mode 187 corresponds to fast-X stripe. The fast-X stripe applies a physical stress test that stresses cells in X-axis direction according to a vertical stripe pattern.

It is noted that the scramblers 140(A-B) can be placed in a close position to the corresponding memory blocks 110(A-B). In an example, the scrambler 140(A) is placed in the memory block 110(A), for example, as a circuit portion within the envelope 130(A). The circuit portion is enabled during a BIST process.

It is also noted that, in an embodiment, the IC chip 100 includes a memory block (not shown) that is not coupled with a scrambler during a BIST process. In an example, when a size of a memory block, such as a number of cells in the memory block, is larger than or equal to a threshold, such as 4 Kbits, and the like, a corresponding scrambler for the memory block is added into the IC chip 100 during IC design. However, when a size of a memory block is smaller than the threshold, no corresponding scrambler is added. The memory block can be separately tested during a BIST process.

It is also noted that, in an embodiment, the scramblers 140(A-B) are used to assist memory test from an external tester 170 in an embodiment of the disclosure. For example, the tester 170 provides test addresses and test data to the scramblers 140(A-B) via an I/O interface 160. The scramblers 140(A-B) operate in parallel, respectively translate the test addresses into the first and second driving addresses and, and translate the test data into the first and second driving data based on the memory configurations of the memory blocks 110(A-B), and respectively provide the first and second driving addresses, and the first and second driving data to corresponding memory blocks 110(A-B).

It is also noted that, in an embodiment, the memory blocks 110(A-B) include redundant cells and suitable circuit that is configured to use the redundant cells to replace cells that fail one or more tests during the BIST process.

It is also noted that, in an embodiment, the scramblers 140(A-B) are configured to perform other suitable functions. In an example, a scrambler, such as the scrambler 140(A), includes a diagnosis function portion. The diagnosis function portion suitably performs read back operations after write operations, and performs diagnosis based on read-back.

Figure 2A:
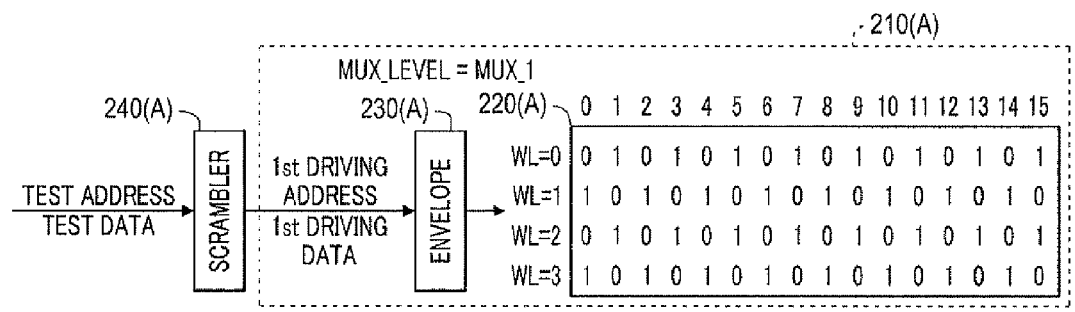
FIGS. 2A-2C show memory writing examples of a checker board pattern according to an embodiment of the disclosure.
Figure 2B:
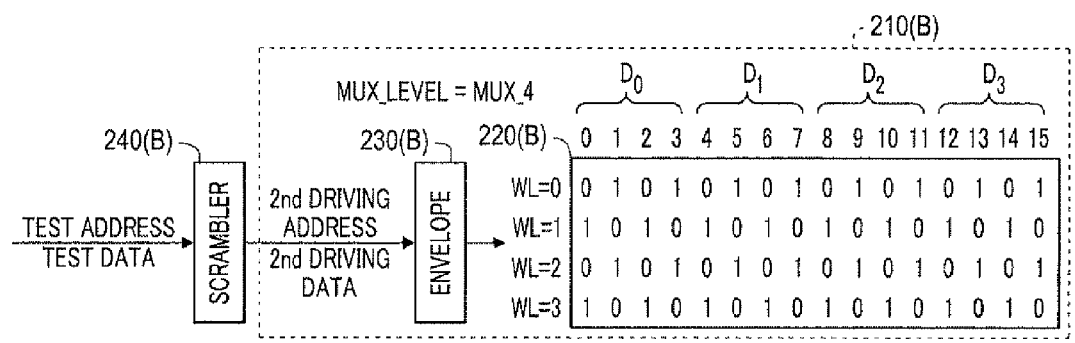

FIGS. 2A-2B show memory writing examples of a checker board pattern according to an embodiment of the disclosure. In FIG. 2A, an envelope 230(A) encloses a memory array 220(A) to form a memory block 210(A). The envelope 230(A) is suitably configured that the memory block 210(A) has a MUX level of one (MUX-1). A scrambler 240(A) is coupled to the memory block 210(A) during a BIST process to translate test address and test data into first driving address and first driving data based on the MUX level of the memory block 210(A). In the FIG. 2A example, the test address is incremental, and the test data corresponding to the checker board pattern. It is noted that the FIG. 2A example can be suitably modified to correspond to a NOT-checker-board pattern that is a bit-inversion of the checker board pattern.

In FIG. 2B, an envelope 230(B) encloses a memory array 220(B) to form a memory block 210(B). The envelope 230(B) is suitably configured that the memory block 210(B) has a MUX level of four (MUX-4). A scrambler 240(B) is coupled to the memory block 210(B) during a BIST process to translate test address and test data into second driving address and second driving data based on the MUX level of the memory block 210(B). In the example of FIG. 2A and FIG. 2B, the test address and the test data are the same. Inasmuch as the scramblers 240(A) and 240(B) respectively translate the test address and the test data based on memory configurations, such as MUX levels, of the memory blocks 210(A) and 210(B), the same test patterns are applied to the memory array 220(A) and 220(B). Thus, in an embodiment, the memory block 210(A) and 210(B) are tested in parallel.

Figure 2C:
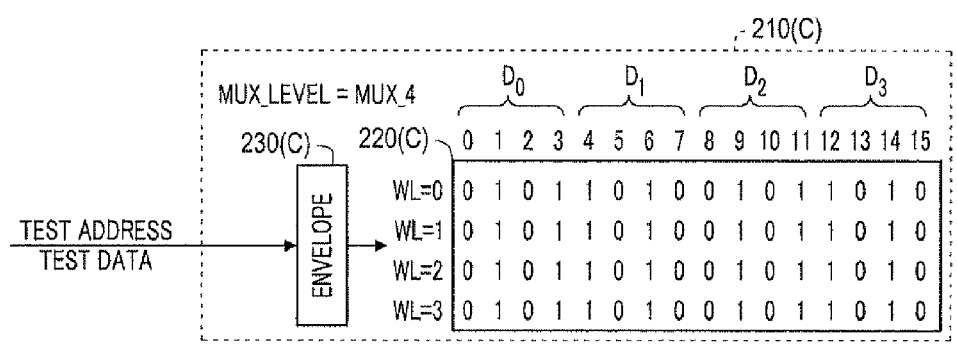

FIG. 2C shows a writing example without scrambler. In FIG. 2C, a memory block 210(C) is similarly configured as the memory block 210(B). Specifically, an envelope 230(C) encloses a memory array 220(C) to form the memory block 210(C). The envelope 230(C) is suitably configured so that the memory block 210(C) has a MUX level of four (MUX-4). When the same test address and test data are provided to the memory block 210(C) without translation by a scrambler, a different test pattern from the checker board pattern is applied to the memory array 220(C).

Figure 3A:
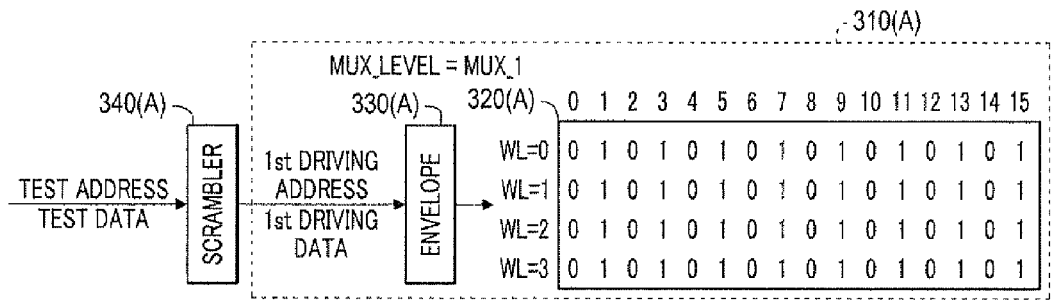
FIGS. 3A-3C show memory writing examples of a stripe pattern according to an embodiment of the disclosure.
Figure 3B:
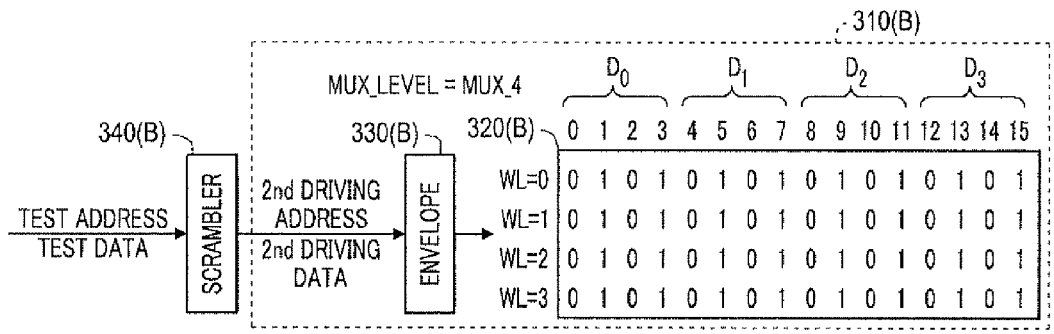

FIGS. 3A-3B show memory writing examples of a fast-X stripe pattern according to an embodiment of the disclosure. In FIG. 3A, an envelope 330(A) encloses a memory array 320(A) to form a memory block 310(A). The envelope 330(A) is suitably configured so that the memory block 310(A) has a MUX level of one (MUX-1). A scrambler 340(A) is coupled to the memory block 310(A) during a BIST process to translate test address and test data into first driving address and first driving data based on the MUX level of the memory block 310(A). In the FIG. 3A example, the test address is incremental, and the test data corresponding to a fast-Y stripe pattern.

In FIG. 3B, an envelope 330(B) encloses a memory array 320(B) to form a memory block 310(B). The envelope 330(B) is suitably configured so that the memory block 310(B) has a MUX level of four (MUX-4). A scrambler 340(B) is coupled to the memory block 310(B) during a BIST process to translate test address and test data into second driving address and second driving data based on the MUX level of the memory block 310(B). In the example of FIG. 3A and FIG. 3B, the test address and the test data are the same. Due to the reason that the scramblers 340(A) and 340(B) respectively translate the test address and the test data based on memory configurations, such as MUX levels, of the memory blocks 310(A) and 310(B), same test patterns are applied to the memory array 320(A) and 320(B). Thus, in an embodiment, the memory block 310(A) and 310(B) are tested in parallel.

Figure 3C:
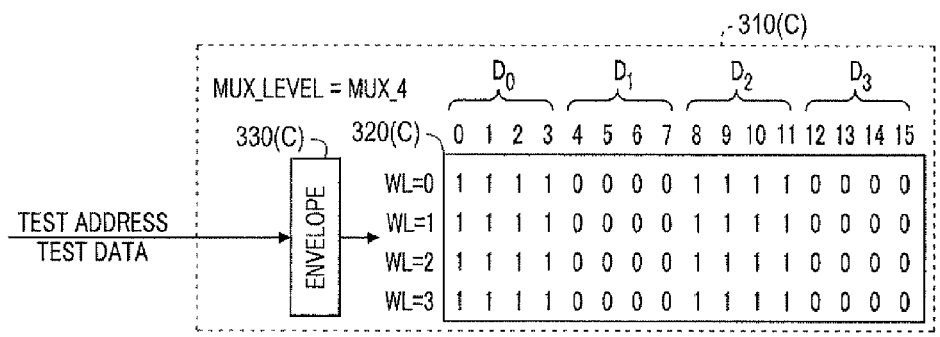

FIG. 3C shows a writing example without scrambler. In FIG. 3C, a memory block 310(C) is similarly configured as the memory block 310(B). Specifically, an envelope 330(C) encloses a memory array 320(C) to form the memory block 310(C). The envelope 330(C) is suitably configured so that the memory block 310(C) has a MUX level of four (MUX-4). When the same test address and test data are provided to the memory block 310(C) without translation by a scrambler, a different test pattern from the fast-Y stripe pattern is applied to the memory array 320(C).

FIG. 4 shows a scrambler algorithm example 400 according to an embodiment of the disclosure. In an example, the scrambler algorithm 400 is implemented as an integrated circuit module and is included in an envelope that encloses a memory array. The integrated circuit module is enabled during a BIST process to translate test addresses and test data into driving addresses and driving data based on memory configuration information, such as MUX level, in the envelope.

The scrambler algorithm 400 translates the test addresses and the test data based on an address scramble mode and a data scramble mode, such as seen in FIG. 1B and FIG. 1C.

Specifically, portion 410 shows variable definitions of received test address and test data from a BIST controller. In the FIG. 4 example, the test address is a logical address that does not need to consider memory configurations. Thus, same test address and test data can be provided to multiple memory blocks to perform BIST in parallel. In the FIG. 4 example, the test data is in the form of data type. Portion 420 shows variable definitions of driving address and driving data that are output from the scrambler algorithm 400. In the FIG. 4 example, the driving data is in the form of data type. Portion 425 shows a relationship between data type and data, which can be the test data or the driving data. Portion 430 shows address scrambling when the address scramble mode is fast-X, intra-MUX-block. Portion 440 shows address scrambling when the address scramble mode is fast-X, inter-MUX-block. Portion 450 shows address scrambling when the address scramble mode is fast-Y. Portion 460 shows data scrambling when the data scramble mode is stripes. Portion 470 shows data scrambling when the data scramble mode is a checker board pattern. It is noted that the portion 470 can be suitably modified when the data scramble mode is a NOT-checker board pattern that is a bit-inversion of the checker board pattern.

It is noted that suitable changes can be made to the scrambler algorithm 400. In an example, the scrambler algorithm does not receive test addresses and test data. The scrambler algorithm receives the address scramble mode and the data scramble mode from the BIST controller. Further, the scrambler algorithm includes a driving address generator and driving data generator. The driving address generator generates driving addresses based on the address scramble mode and the MUX level information in the envelope, for example. The driving data generator generates the driving data based on the data scramble mode and the MUX level information, for example.

Figure 5:
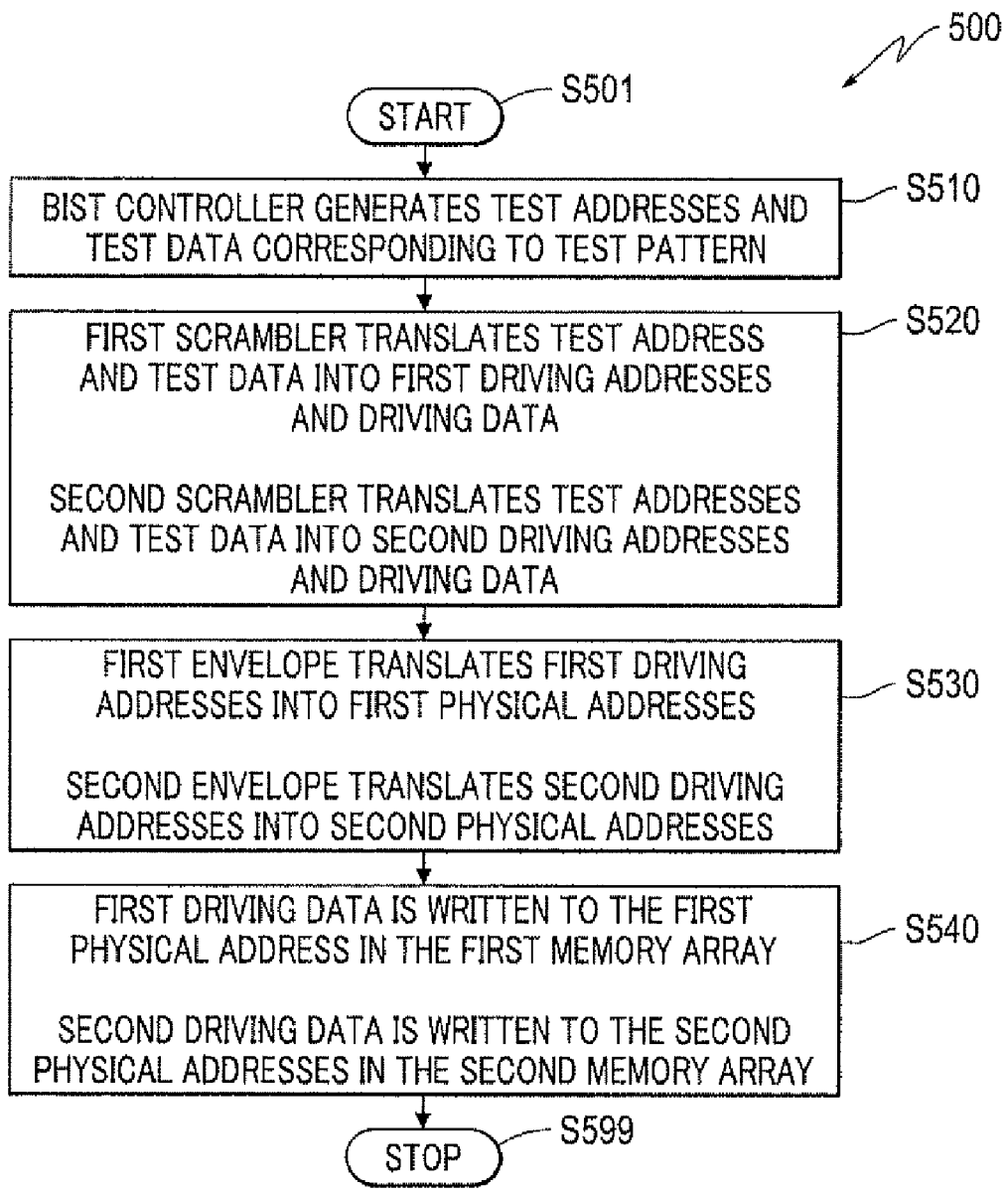
FIG. 5 shows a flowchart outlining a process 500 for applying a test pattern to multiple memory blocks in parallel in a BIST process according to an embodiment of the disclosure.

FIG. 5 shows a flowchart outlining a process 500 for applying a test pattern to a first memory block and a second memory block in parallel in a BIST process according to an embodiment of the disclosure. The first memory block includes a first envelope and a first memory array. The first envelope encloses the first memory array according to a first memory configuration, such as a first MUX level. The second memory block includes a second envelope and a second memory array. The second envelope encloses the second memory array according to a second memory configuration, such as a second MUX level. The first MUX level and the second MUX level can be the same or different. During the BIST process, the first memory block is coupled to a first scrambler, and the second memory block is coupled to a second scrambler. The process starts at S501, and proceeds to S510.

At S510, a BIST controller, such as the BIST controller 155 generates test addresses and test data corresponding to the test pattern. The test addresses are logical addresses that do not need to take consideration of memory configurations. Thus, the test addresses and the test data can be used to test the first and second memory blocks in parallel.

At S520, the first scrambler translates the test addresses and the test data into first driving addresses and first driving data based on the first MUX level of the first memory block. The second scrambler translates the test addresses and the test data into second driving addresses and second driving data based on the second MUX level of the second memory block.

At S530, the first envelope translates the first driving addresses into first physical addresses of the first memory array based on the first MUX level. The second envelope translates the second driving addresses into second physical addresses of the second memory array based on the second MUX level.

At S540, the first driving data is written to the first memory array according to the first physical addresses, and the second driving data is written to the second memory array according to the second physical addresses. The first scrambler and the second scrambler can be suitably formed, such as according to the scrambler algorithm 400, thus the same test pattern is applied to the first memory array and the second memory array. The process then proceeds to S599 and terminates.

It is noted that the process 500 can be suitably modified. In an example, in S510, the BIST controller determines an address scrambler mode and a data scramble mode corresponding to a test pattern instead of generating the test addresses and test data. Then, in S520, the first scrambler generates the first driving addresses based on the address scramble mode and the first MUX level, and generates the first data based on the data scramble mode and the first MUX level. In parallel, the second scrambler generates the second driving addresses based on the address scramble mode and the second MUX level, and generates the second data based on the data scramble mode and the second MUX level.

It is also noted that the process 500 can be suitably modified for performing reading operations in parallel.

While the invention has been described in conjunction with the specific embodiments thereof that are proposed as examples, it is evident that many alternatives, modifications, and variations will be apparent to those skilled in the art. Accordingly, embodiments of the invention as set forth herein are intended to be illustrative, not limiting. There are changes that may be made without departing from the scope of the invention.

What is claimed is:

1. An integrated circuit, comprising:
a first memory array;
a first envelope configured to translate a driving address into a corresponding physical address of the first memory array based on a first memory configuration for using the first memory array; and
a first scrambler configured to provide a first plurality of driving addresses and associated first data to the first envelope based on the first memory configuration, the first plurality of driving addresses and the first data being used to test the first memory array according to a first test pattern.

2. The integrated circuit of claim 1, further comprising:
a second memory array;
a second envelope configured to translate a driving address into a physical address of the second memory array based on a second memory configuration for using the second memory array; and
a second scrambler configured to provide a second plurality of driving addresses and associated second data to the second envelope based on the second memory configuration, the second plurality of driving addresses and the second data being used to test the second memory array according to a second test pattern.

3. The integrated circuit of claim 2, wherein;
a built-in self-test (BIST) controller is configured to provide a plurality of test addresses and associated test data for testing the first memory array and the second memory array in parallel;
the first scrambler is configured to translate the plurality of test addresses into the first plurality of driving addresses and translate the test data into the first data for testing the first memory array according to the first test pattern; and
the second scrambler is configured to translate the plurality of test addresses into the second plurality of driving addresses and translate the test data into the second data for testing the second memory array according to the second test pattern.

4. The integrated circuit of claim 3, wherein the first scrambler and the second scrambler are configured to translate the plurality of test addresses and the test data according to a same test pattern.

5. The integrated circuit of claim 3, wherein the built-in self-test (BIST) controller is configured to provide logical addresses as the plurality of test addresses for testing the first memory array and the second memory array in parallel.

6. The integrated circuit of claim 3, wherein:
the built-in self-test controller is configured to provide an address scramble mode, and a data scramble mode to the first scrambler and the second scrambler.

7. The integrated circuit of claim 5, wherein
the first scrambler is configured to provide the first plurality of driving addresses based on the first memory configuration and the address scramble mode, and provide the first data based on the first memory configuration and the data scramble mode; and
the second scrambler is configured to provide the second plurality of driving addresses based on the second memory configuration and the address scramble mode, and provide the second data based on the second memory configuration and the data scramble mode.

8. The integrated circuit of claim 2, wherein:
an I/O interface is configured to receive a plurality of test addresses and associated test data from an external source, and to provide the plurality of test addresses and the associated test data to the first scrambler and the second scrambler to test the first memory array and the second memory array in parallel;
the first scrambler is configured to translate the plurality of test addresses into the first plurality of driving addresses and to translate the test data into the first data based on the first memory configuration; and
the second scrambler is configured to translate the plurality of test addresses into the second plurality of driving addresses and to translate the test data into the second data based on the second memory configuration.

9. The integrated circuit of claim 2, wherein:
the first memory configuration includes a first MUX level; and
the second memory configuration includes a second MUX level that is different from the first MUX level.

10. The integrated circuit of claim 1, wherein a number of cells in the first memory array is larger than a threshold.

11. A method for memory testing, comprising:
receiving by a first scrambler a plurality of test addresses and associated test data for testing a first memory array;
translating the plurality of test addresses and associated test data into a first plurality of driving addresses and first data based on a first memory configuration for using the first memory array; and
providing the first plurality of driving addresses and the first data to a first envelope that envelops the first memory array, the first envelope translating the first plurality of driving addresses into a first plurality of physical addresses based on the first memory configuration, and the first data being written to the first plurality of physical addresses of the first memory array.

12. The method of claim 11, further comprising:
receiving by a second scrambler the plurality of test addresses and the test data for testing a second memory array;
translating the plurality of test addresses and associated test data into a second plurality of driving addresses and second data based on a second memory configuration for using the second memory array; and
providing the second plurality of driving addresses and the second data to a second envelope that envelops the second memory array, the second envelope translating the second plurality of driving addresses into a second plurality of physical addresses based on the second memory configuration, and the second data being written to the second plurality of physical addresses of the second memory array.

13. The method of claim 12, further comprising:
receiving the plurality of test addresses and the test data generated by a built-in self-test (BIST) controller; and
using the plurality of test addresses and the test data for testing the first memory array and the second memory array in parallel.

14. The method of claim 12, further comprising:
receiving the plurality of test addresses and the test data from an external source; and
using the plurality of test addresses and the test data for testing the first memory array and the second memory array in parallel.

15. The method of claim 11, wherein translating the plurality of test addresses and associated test data into the first plurality of driving addresses and first data based on the first memory configuration for using the first memory array, further comprises:
translating the plurality of test addresses and associated test data into the first plurality of driving addresses and first data based on a MUX level for using the first memory array.

16. A method for memory testing, comprising:
receiving by a first scrambler an address scramble mode and a data scramble mode for testing a first memory array;
generating a first plurality of driving addresses based on the address scramble mode and the a first memory configuration for using the first memory array;
generating first data based on the data scramble mode and the first memory configuration; and
providing the first plurality of driving addresses and the first data to a first envelope that envelops the first memory array, the first envelope translating the first plurality of driving addresses into a first plurality of physical addresses based on the first memory configuration, and the first data being written to the first plurality of physical addresses of the first memory array.

17. The method of claim 16, further comprising:
receiving by a second scrambler the address scramble mode and the data scramble mode for testing a second memory array;
generating a second plurality of driving addresses based on the address scramble mode and a second memory configuration for using the second memory array;
generating second data based on the data scramble mode and the second memory configuration; and
providing the second plurality of driving addresses and the second data to a second envelope that envelops the second memory array, the second envelope translating the second plurality of driving addresses into a second plurality of physical addresses based on the second memory configuration, and the second data being written to the second plurality of physical addresses of the second memory array.

18. The method of claim 17, wherein
receiving the address scramble mode and the data scramble mode from a built-in self-test (BIST) controller.

19. The method of claim 17, further comprising:
receiving the address scramble mode and the data scramble mode from an external tester.

20. The method of claim 16, wherein
generating the first plurality of driving addresses based on the address scramble mode and a MUX level for using the first memory array; and
generating the first data based on the data scramble mode and the MUX level.

* * * * *